United States Patent
Han et al.

(10) Patent No.: US 12,355,284 B2
(45) Date of Patent: Jul. 8, 2025

(54) PROTECTION CIRCUIT MODULE AND AEROSOL GENERATING DEVICE INCLUDING THE SAME

(71) Applicant: KT&G CORPORATION, Daejeon (KR)

(72) Inventors: Daenam Han, Seoul (KR); Seoksu Jang, Seoul (KR); Seungwon Lee, Gwangmyung-si (KR); Sungwook Yoon, Suwon-si (KR); Yonghwan Kim, Anyang-si (KR)

(73) Assignee: KT&G CORPORATION, Daejeon (KR)

( * ) Notice: Subject to any disclaimer, the term of this patent is extended or adjusted under 35 U.S.C. 154(b) by 452 days.

(21) Appl. No.: 17/911,323

(22) PCT Filed: Nov. 5, 2021

(86) PCT No.: PCT/KR2021/016008
§ 371 (c)(1),
(2) Date: Sep. 13, 2022

(87) PCT Pub. No.: WO2022/103082
PCT Pub. Date: May 19, 2022

(65) Prior Publication Data
US 2023/0112731 A1 Apr. 13, 2023

(30) Foreign Application Priority Data
Nov. 11, 2020 (KR) .................. 10-2020-0149977

(51) Int. Cl.
*H02J 7/00* (2006.01)
*A24F 40/51* (2020.01)
(Continued)

(52) U.S. Cl.
CPC .......... *H02J 7/00309* (2020.01); *A24F 40/51* (2020.01); *A24F 40/57* (2020.01);
(Continued)

(58) Field of Classification Search
None
See application file for complete search history.

(56) References Cited

U.S. PATENT DOCUMENTS

| 10,263,238 | B2 * | 4/2019 | Hwang | H01M 50/581 |
| 2015/0372516 | A1 * | 12/2015 | Na | H02J 7/00304 |
| | | | | 361/93.9 |
| 2018/0053969 | A1 * | 2/2018 | Eklund | H01M 10/4257 |
| 2018/0301915 | A1 | 10/2018 | Colotte et al. | |

(Continued)

FOREIGN PATENT DOCUMENTS

| CN | 201482667 | 5/2010 |
| CN | 105324871 | 2/2016 |

(Continued)

OTHER PUBLICATIONS

Japan Patent Office Application No. 2023-514043, Office Action dated Apr. 2, 2024, 3 pages.

(Continued)

*Primary Examiner* — Dennis R Cordray
(74) *Attorney, Agent, or Firm* — LEE, HONG, DEGERMAN, KANG & WAIMEY (57) ABSTRACT

A protection circuit module and an aerosol-generating device including the same are disclosed. The aerosol-generating device of the disclosure includes a heater for heating an aerosol-generating substance, a first circuit board on which a controller for controlling operation of the heater is mounted, a battery for supplying electric power to the heater under the control of the controller, and a protection circuit module electrically connected to the battery to control at least one function of the battery. The protection circuit module includes a package module including an integrated circuit, including multiple active elements and passive elements to protect the battery, in an inner sealed space therein, the package module being in contact with the battery, a connector coupled to the first circuit board, and a second circuit board, on which the connector and the package module are mounted and which electrically interconnects the connector and the package module.

15 Claims, 8 Drawing Sheets

(51) Int. Cl.
    *A24F 40/57*   (2020.01)
    *H01M 10/42*   (2006.01)
    *H01M 10/48*   (2006.01)
    *H05K 1/14*    (2006.01)
    *H05K 1/18*    (2006.01)

(52) U.S. Cl.
    CPC ....... *H01M 10/425* (2013.01); *H01M 10/486* (2013.01); *H05K 1/14* (2013.01); *H05K 1/181* (2013.01); *H01M 2220/30* (2013.01)

(56) References Cited

U.S. PATENT DOCUMENTS

| | | | |
|---|---|---|---|
| 2019/0190088 | A1 | 6/2019 | Leadley |
| 2019/0319466 | A1 | 10/2019 | Pk |

FOREIGN PATENT DOCUMENTS

| | | |
|---|---|---|
| CN | 106575877 | 4/2017 |
| CN | 110868875 | 3/2020 |
| CN | 111543676 | 8/2020 |
| EP | 2073295 | 6/2009 |
| JP | 2006-187185 | 7/2006 |
| KR | 10-2009-0064961 | 6/2009 |
| KR | 10-2012-0047542 | 5/2012 |
| KR | 20-2015-0000418 | 1/2015 |
| KR | 10-2016-0039790 | 4/2016 |
| WO | 2019229955 | 12/2019 |
| WO | 2020005956 | 1/2020 |

OTHER PUBLICATIONS

PCT International Application No. PCT/KR2021/016008, International Search Report dated Feb. 28, 2022, 2 pages.
European Patent Office Application Serial No. 21892250.8, Search Report dated Dec. 18, 2024, 11 pages.
The State Intellectual Property Office of the People's Republic of China Application Serial No. 202180025872.1, Office Action dated Feb. 28, 2025, 25 pages.

* cited by examiner

PROTECTION CIRCUIT MODULE AND AEROSOL GENERATING DEVICE INCLUDING THE SAME

CROSS-REFERENCE TO RELATED APPLICATIONS

This application is the National Stage filing under 35 U.S.C. 371 of International Application No. PCT/KR2021/016008, filed on Nov. 5, 2021, which claims the benefit of earlier filing date and right of priority to Korean Application No. 10-2020-0149977, filed on Nov. 11, 2020, the contents of which are all hereby incorporated by reference herein their entirety.

TECHNICAL FIELD

The present disclosure relates to a protection circuit module and an aerosol-generating device including the same.

BACKGROUND ART

An aerosol-generating device is a device that extracts certain components from a medium or a substance by forming an aerosol. The medium may contain a multicomponent substance. The substance contained in the medium may be a multicomponent flavoring substance. For example, the substance contained in the medium may include a nicotine component, an herbal component, and/or a coffee component. Recently, various research on aerosol-generating devices has been conducted.

Meanwhile, the aerosol-generating device may generate an aerosol using the electric power of a battery. However, the battery is composed of various combustible materials. For this reason, the battery has a likelihood of generating heat or exploding due to overvoltage, overcurrent, overcharging, or external physical impacts. Therefore, a conventional general aerosol-generating device includes a protection circuit module (PCM) in order to prevent a battery from generating heat or exploding. The protection circuit module (PCM) may sense and treat an abnormal state of the battery based on the voltage applied to the battery, the current flowing through the battery, or the temperature of the battery.

The conventional protection circuit module (PCM) is configured such that multiple active elements and passive elements are individually mounted on one surface or both surfaces of a printed circuit board (PCB). In the case in which foreign substances, such as moisture or dust, enter the aerosol-generating device, circuit elements mounted on the printed circuit board are directly exposed to the foreign substances. For example, when fine cracks are formed in the internal structure of the aerosol-generating device, an aerosol enters the aerosol-generating device. In this case, the protection circuit module (PCM) may malfunction, thus failing to reliably prevent the battery from generating heat or exploding. Also, in the case in which the circuit elements mounted on the printed circuit board are covered with a separate component (e.g. a sheet of insulating tape), foreign substances may reach the circuit elements through fine gaps.

DISCLOSURE OF INVENTION

Technical Problem

It is an object of the present disclosure to solve the above and other problems.

It is another object of the present disclosure to provide a protection circuit module (PCM) capable of preventing elements constituting the protection circuit module from being exposed to foreign substances and an aerosol-generating device including the same.

Solution to Problem

A protection circuit module according to an embodiment of the present disclosure for accomplishing the above and other objects may be electrically connected to a battery to control at least one function of the battery. The protection circuit module may include a package module including an integrated circuit, including multiple active elements and passive elements to protect the battery, in an inner sealed space therein, the package module being disposed so as to be in contact with the battery, a connector coupled to a first circuit board, and a second circuit board on which the connector and the package module are mounted, the second circuit board electrically interconnecting the connector and the package module.

An aerosol-generating device according to an embodiment of the present disclosure for accomplishing the above and other objects may include a heater configured to heat an aerosol-generating substance, a first circuit board on which a controller configured to control the operation of the heater is mounted, a battery configured to supply electric power to the heater under the control of the controller, and a protection circuit module electrically connected to the battery to control at least one function of the battery. The protection circuit module may include a package module including an integrated circuit, including multiple active elements and passive elements to protect the battery, in an inner sealed space therein, the package module being disposed so as to be in contact with the battery, a connector coupled to the first circuit board, and a second circuit board on which the connector and the package module are mounted, the second circuit board electrically interconnecting the connector and the package module.

Advantageous Effects of Invention

According to at least one of embodiments of the present disclosure, it is possible to prevent elements for protecting a battery, which are included in an integrated circuit (IC), from being exposed to foreign substances.

In addition, according to at least one of embodiments of the present disclosure, it is possible to prevent a battery temperature sensor from being damaged by foreign substances more reliably than in the case in which a separate battery temperature sensor is disposed adjacent to a battery.

Additional applications of the present disclosure will become apparent from the following detailed description. However, because various changes and modifications will be clearly understood by those skilled in the art within the spirit and scope of the present disclosure, it should be understood that the detailed description and specific embodiments, such as preferred embodiments of the present disclosure, are merely given by way of example.

BRIEF DESCRIPTION OF DRAWINGS

The above and other objects, features and other advantages of the present disclosure will be more clearly understood from the following detailed description taken in conjunction with the accompanying drawings, in which:

FIGS. 2A to 4 are views for explaining an aerosol-generating device according to embodiments of the present disclosure;

BEST MODE FOR CARRYING OUT THE INVENTION

Hereinafter, the embodiments disclosed in the present specification will be described in detail with reference to the accompanying drawings. The same or similar elements are denoted by the same reference numerals even though they are depicted in different drawings, and redundant descriptions thereof will be omitted.

In the following description, with respect to constituent elements used in the following description, the suffixes "module" and "unit" are used only in consideration of facilitation of description. The "module" and "unit" are do not have mutually distinguished meanings or functions.

In addition, in the following description of the embodiments disclosed in the present specification, a detailed description of known functions and configurations incorporated herein will be omitted when the same may make the subject matter of the embodiments disclosed in the present specification rather unclear. In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents, and substitutions within the scope and spirit of the present disclosure.

It will be understood that the terms "first", "second", etc., may be used herein to describe various components. However, these components should not be limited by these terms. These terms are only used to distinguish one component from another component.

It will be understood that when a component is referred to as being "connected to" or "coupled to" another component, it may be directly connected to or coupled to another component. However, it will be understood that intervening components may be present. On the other hand, when a component is referred to as being "directly connected to" or "directly coupled to" another component, there are no intervening components present.

As used herein, the singular form is intended to include the plural forms as well, unless the context clearly indicates otherwise.

Figure 1:
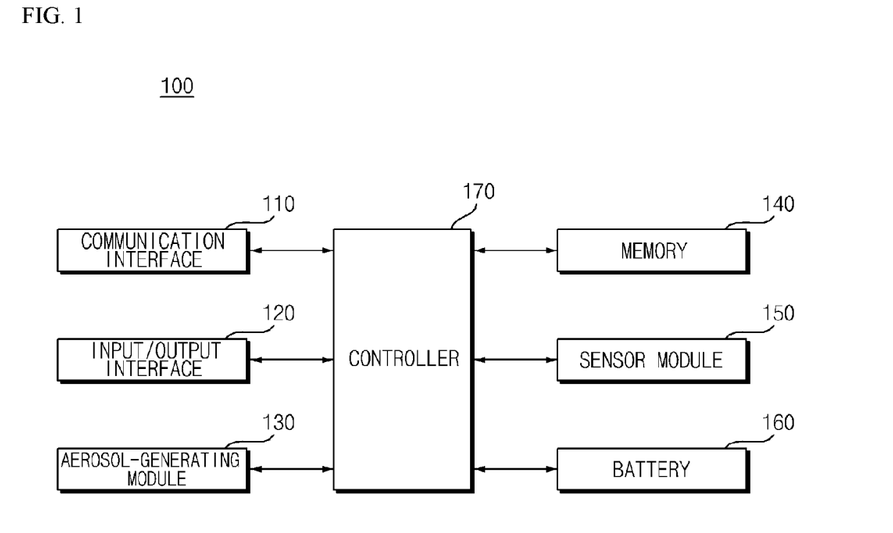
FIG. 1 is a block diagram of an aerosol-generating device according to an embodiment of the present disclosure.

FIG. 1 is a block diagram of an aerosol-generating device according to an embodiment of the present disclosure.

Referring to FIG. 1, an aerosol-generating device 100 may include a communication interface 110, an input/output interface 120, an aerosol-generating module 130, a memory 140, a sensor module 150, a battery 160, and/or a controller 170.

In one embodiment, the aerosol-generating device 100 may be composed only of a main body. In this case, components included in the aerosol-generating device 100 may be located in the main body. In another embodiment, the aerosol-generating device 100 may be composed of a cartridge, which contains an aerosol-generating substance, and a main body. In this case, the components included in the aerosol-generating device 100 may be located in at least one of the main body or the cartridge.

The communication interface 110 may include at least one communication module for communication with an external device and/or a network. For example, the communication interface 110 may include a communication module for wired communication, such as a Universal Serial Bus (USB). For example, the communication interface 110 may include a communication module for wireless communication, such as Wireless Fidelity (Wi-Fi), Bluetooth, Bluetooth Low Energy (BLE), ZigBee, or nearfield communication (NFC).

The input/output interface 120 may include an input device (not shown) for receiving a command from a user and/or an output device (not shown) for outputting information to the user. For example, the input device may include a touch panel, a physical button, a microphone, or the like. For example, the output device may include a display device for outputting visual information, such as a display or a light-emitting diode (LED), an audio device for outputting auditory information, such as a speaker or a buzzer, a motor for outputting tactile information such as haptic effect, or the like.

The input/output interface 120 may transmit data corresponding to a command input by the user through the input device to another component (or other components) of the aerosol-generating device 100. The input/output interface 120 may output information corresponding to data received from another component (or other components) of the aerosol-generating device 100 through the output device.

The aerosol-generating module 130 may generate an aerosol from an aerosol-generating substance. Here, the aerosol-generating substance may be a substance in a liquid state, a solid state, or a gel state, which is capable of generating an aerosol, or a combination of two or more aerosol-generating substances.

According to an embodiment, the liquid aerosol-generating substance may be a liquid including a tobacco-containing material having a volatile tobacco flavor component. According to another embodiment, the liquid aerosol-generating substance may be a liquid including a non-tobacco material. For example, the liquid aerosol-generating substance may include water, solvents, nicotine, plant extracts, flavorings, flavoring agents, vitamin mixtures, etc.

The solid aerosol-generating substance may include a solid material based on a tobacco raw material such as a reconstituted tobacco sheet, shredded tobacco, or granulated tobacco. In addition, the solid aerosol-generating substance may include a solid material having a taste control agent and a flavoring material. For example, the taste control agent may include calcium carbonate, sodium bicarbonate, calcium oxide, etc. For example, the flavoring material may include a natural material such as herbal granules, or may include a material such as silica, zeolite, or dextrin, which includes an aroma ingredient.

In addition, the aerosol-generating substance may further include an aerosol-forming agent such as glycerin or propylene glycol.

The aerosol-generating module 130 may include at least one heater (not shown).

The aerosol-generating module 130 may include an electro-resistive heater. For example, the electro-resistive heater may include at least one electrically conductive track. The electro-resistive heater may be heated as current flows through the electrically conductive track. At this time, the aerosol-generating substance may be heated by the heated electro-resistive heater.

The electrically conductive track may include an electro-resistive material. In one example, the electrically conductive track may be formed of a metal material. In another example, the electrically conductive track may be formed of a ceramic material, carbon, a metal alloy, or a composite of a ceramic material and metal.

The electro-resistive heater may include an electrically conductive track that is formed in any of various shapes. For example, the electrically conductive track may be formed in any one of a tubular shape, a plate shape, a needle shape, a rod shape, and a coil shape.

The aerosol-generating module 130 may include a heater that uses an induction-heating method. For example, the induction heater may include an electrically conductive coil. The induction heater may generate an alternating magnetic field, which periodically changes in direction, by adjusting the current flowing through the electrically conductive coil. At this time, when the alternating magnetic field is applied to a magnetic body, energy loss may occur in the magnetic body due to eddy current loss and hysteresis loss. In addition, the lost energy may be released as thermal energy. Accordingly, the aerosol-generating substance located adjacent to the magnetic body may be heated. Here, an object that generates heat due to the magnetic field may be referred to as a susceptor.

Meanwhile, the aerosol-generating module 130 may generate ultrasonic vibrations to thereby generate an aerosol from the aerosol-generating substance.

The aerosol-generating modules 130 may be referred to as a cartomizer, an atomizer, or a vaporizer.

The memory 140 may store programs for processing and controlling each signal in the controller 170, and may store processed data and data to be processed.

For example, the memory 140 may store applications designed for the purpose of performing various tasks that can be processed by the controller 170. The memory 140 may selectively provide some of the stored applications in response to the request from the controller 170.

For example, the memory 140 may store data on the operation time of the aerosol-generating device 100, the maximum number of puffs, the current number of puffs, at least one temperature profile, at least one electric power profile, and the user's inhalation pattern. Here, "puff" means inhalation by the user. "inhalation" means the user's act of taking air or other substances into the user's oral cavity, nasal cavity, or lungs through the user's mouth or nose.

The memory 140 may include at least one of volatile memory (e.g. dynamic random access memory (DRAM), static random access memory (SRAM), or synchronous dynamic random access memory (SDRAM)), nonvolatile memory (e.g. flash memory), a hard disk drive (HDD), or a solid-state drive (SSD).

The sensor module 150 may include at least one sensor.

For example, the sensor module 150 may include a sensor for sensing a puff (hereinafter referred to as a "puff sensor"). In this case, the puff sensor may be implemented by a proximity sensor such as an IR sensor, a pressure sensor, a gyro sensor, an acceleration sensor, a magnetic field sensor, or the like.

For example, the sensor module 150 may include a sensor for sensing the temperature of the heater included in the aerosol-generating module 130 and the temperature of the aerosol-generating substance (hereinafter referred to as a "temperature sensor"). In this case, the heater included in the aerosol-generating module 130 may also serve as the temperature sensor. For example, the electro-resistive material of the heater may be a material having a predetermined temperature coefficient of resistance. The sensor module 150 may measure the resistance of the heater, which varies according to the temperature, to thereby sense the temperature of the heater.

For example, in the case in which the main body of the aerosol-generating device 100 is formed to allow a cigarette to be inserted thereinto, the sensor module 150 may include a sensor for sensing insertion of the cigarette (hereinafter referred to as a "cigarette detection sensor").

For example, in the case in which the aerosol-generating device 100 includes a cartridge, the sensor module 150 may include a sensor for sensing mounting/demounting of the cartridge and the position of the cartridge (hereinafter referred to as a "cartridge detection sensor").

In this case, the cigarette detection sensor and/or the cartridge detection sensor may be implemented as an inductance-based sensor, a capacitive sensor, a resistance sensor, or a Hall sensor (or Hall IC) using a Hall effect.

For example, the sensor module 150 may include a voltage sensor for sensing a voltage applied to a component (e.g. the battery 160) provided in the aerosol-generating device 100 and/or a current sensor for sensing a current.

The battery 160 may supply electric power used for the operation of the aerosol-generating device 100 under the control of the controller 170. The battery 160 may supply electric power to other components provided in the aerosol-generating device 100. For example, the battery 160 may supply electric power to the communication module included in the communication interface 110, the output device included in the input/output interface 120, and the heater included in the aerosol-generating module 130.

The battery 160 may be a rechargeable battery or a disposable battery. For example, the battery 160 may be a lithium-ion (Li-ion) battery or a lithium polymer (Li-polymer) battery. However, the present disclosure is not limited thereto. For example, when the battery 160 is rechargeable, the charging rate (C-rate) of the battery 160 may be 10C, and the discharging rate (C-rate) thereof may be 10C to 20C. However, the present disclosure is not limited thereto. Also, for stable use, the battery 160 may be manufactured such that 80% or more of the total capacity may be ensured even when charging/discharging is performed 2000 times.

The aerosol-generating device 100 may further include a power terminal (not shown) to which electric power supplied from the outside is input. For example, a power line may be connected to the power terminal, which is disposed at one side of the main body of the aerosol-generating device 100. The aerosol-generating device 100 may use the electric power supplied through the power line connected to the power terminal to charge the battery 160. In this case, the power terminal may be a wired terminal for USB communication.

The aerosol-generating device 100 may wirelessly receive electric power supplied from the outside through the communication interface 110. For example, the aerosol-generating device 100 may wirelessly receive electric power using an antenna included in the communication module for wireless communication. The aerosol-generating device 100 may charge the battery 160 using the wirelessly supplied electric power.

The controller 170 may control the overall operation of the aerosol-generating device 100. The controller 170 may be connected to each of the components provided in the aerosol-generating device 100. The controller 170 may transmit and/or receive a signal to and/or from each of the components, thereby controlling the overall operation of each of the components.

The controller 170 may include at least one processor. The controller 170 may control the overall operation of the aerosol-generating device 100 using the processor included therein. Here, the processor may be a general processor such as a central processing unit (CPU). Of course, the processor may be a dedicated device such as an application-specific integrated circuit (ASIC), or may be any of other hardware-based processors.

The controller 170 may perform any one of a plurality of functions of the aerosol-generating device 100. For example, the controller 170 may perform any one of a plurality of functions of the aerosol-generating device 100 (e.g. a pre-heating function, a heating function, a charging function, and a cleaning function) according to the state of each of the components provided in the aerosol-generating device 100 and the user's command received through the input/output interface 120.

The controller 170 may control the operation of each of the components provided in the aerosol-generating device 100 based on data stored in the memory 140. For example, the controller 170 may control the supply of a predetermined amount of electric power from the battery 160 to the aerosol-generating module 130 for a predetermined time based on the data on the temperature profile, the electric power profile, and the user's inhalation pattern, which is stored in the memory 140.

The controller 170 may determine the occurrence or non-occurrence of a puff using the puff sensor included in the sensor module 150. For example, the controller 170 may check a temperature change, a flow change, a pressure change, and a voltage change in the aerosol-generating device 100 based on the values sensed by the puff sensor. The controller 170 may determine the occurrence or non-occurrence of a puff based on the value sensed by the puff sensor.

The controller 170 may control the operation of each of the components provided in the aerosol-generating device 100 according to the occurrence or non-occurrence of a puff and/or the number of puffs. For example, upon determining that a puff has occurred, the controller 170 may perform control such that electric power is supplied to the heater according to the electric power profile stored in the memory 140. For example, the controller 170 may perform control such that the temperature of the heater is changed according to the number of puffs based on the temperature profile stored in the memory 140.

The controller 170 may perform control such that the supply of electric power to the heater is interrupted according to a predetermined condition. For example, the controller 170 may perform control such that the supply of electric power to the heater is interrupted when the cigarette is removed, when the cartridge is demounted, when the number of puffs reaches the predetermined maximum number of puffs, when a puff is not sensed during a predetermined period of time or longer, or when the remaining capacity of the battery 160 is less than a predetermined value.

The controller 170 may calculate the remaining capacity with respect to the full charge capacity of the battery 160. For example, the controller 170 may calculate the remaining capacity of the battery 160 based on the values sensed by the voltage sensor and/or the current sensor included in the sensor module 150.

FIGS. 2A to 4 are views for explaining the aerosol-generating device according to embodiments of the present disclosure.

According to various embodiments of the present disclosure, the aerosol-generating device 100 may include a main body and/or a cartridge.

Figure 2A:
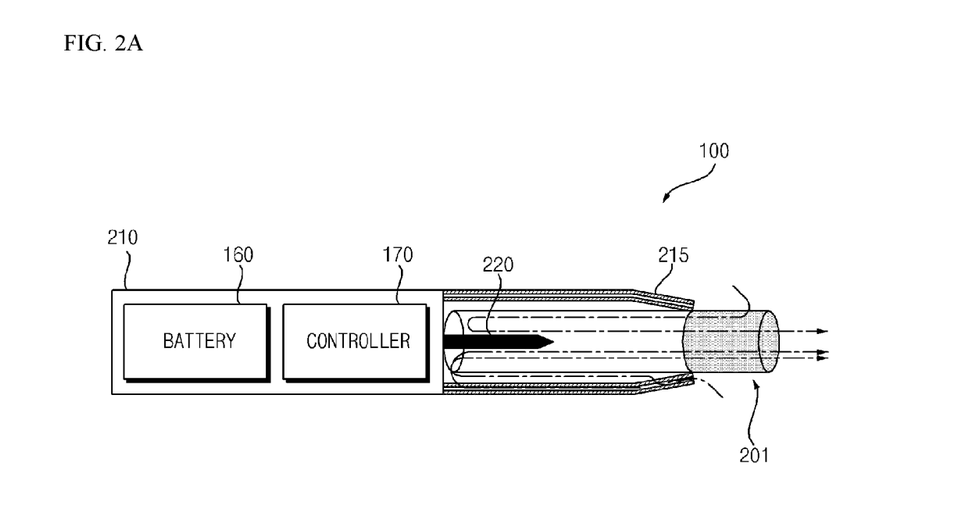

Referring to FIG. 2A, the aerosol-generating device 100 according to an embodiment may include a main body 210, which is formed such that a cigarette 201 can be inserted into the inner space formed by a housing 215.

The cigarette 201 may be similar to a general combustive cigarette. For example, the cigarette 201 may be divided into a first portion including an aerosol-generating substance and a second portion including a filter. Alternatively, the second portion of the cigarette 201 may also include an aerosol-generating substance. For example, a granular or capsular flavoring material may be inserted into the second portion.

The entirety of the first portion may be inserted into the aerosol-generating device 100. The second portion may be exposed to the outside. Alternatively, only a portion of the first portion may be inserted into the aerosol-generating device 100. Alternatively, the entirety of the first portion and a portion of the second portion may be inserted into the aerosol-generating device 100. The user may inhale the aerosol in the state of holding the second portion in the mouth. At this time, the aerosol may be generated as external air passes through the first portion. The generated aerosol may pass through the second portion to be introduced into the mouth of the user.

The main body 210 may be structured such that external air is introduced into the main body 210 in the state in which the cigarette 201 is inserted thereinto. In this case, the external air introduced into the main body 210 may flow into the mouth of the user via the cigarette 201.

When the cigarette 201 is inserted, the controller 170 may perform control such that electric power is supplied to the heater based on the temperature profile stored in the memory 140.

The heater may be disposed in the main body 210 at a position corresponding to the position at which the cigarette 201 is inserted into the main body 210. Although it is illustrated in the drawings that the heater is an electrically conductive heater 220 including a needle-shaped electrically conductive track, the present disclosure is not limited thereto.

The heater may heat the interior and/or exterior of the cigarette 201 using the electric power supplied from the battery 160. An aerosol may be generated from the heated cigarette 201. At this time, the user may hold one end of the cigarette 201 in the mouth to inhale the aerosol containing a tobacco material.

Meanwhile, the controller 170 may perform control such that electric power is supplied to the heater in the state in which the cigarette 201 is not inserted into the main body according to a predetermined condition. For example, when a cleaning function for cleaning the space into which the cigarette 201 is inserted is selected in response to a command input by the user through the input/output interface 120, the controller 170 may perform control such that a predetermined amount of electric power is supplied to the heater.

The controller 170 may monitor the number of puffs based on the value sensed by the puff sensor from the time point at which the cigarette 201 was inserted into the main body.

When the cigarette 201 is removed from the main body, the controller 170 may initialize the current number of puffs stored in the memory 140.

Figure 2B:
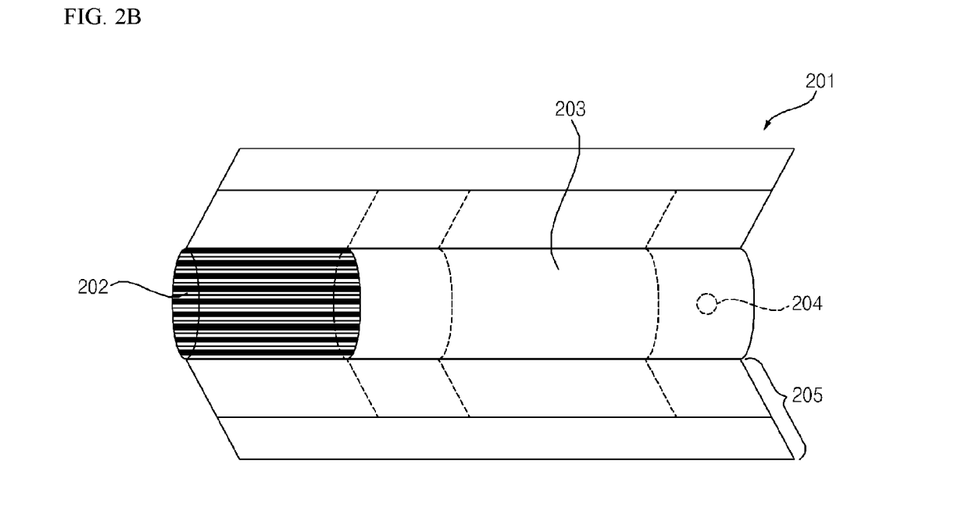

Referring to FIG. 2B, the cigarette 201 according to an embodiment may include a tobacco rod 202 and a filter rod 203. The first portion described above with reference to FIG. 2A may include the tobacco rod 202. The second portion described above with reference to FIG. 2A may include the filter rod 203.

Although it is illustrated in FIG. 2B that the filter rod 203 is composed of a single segment, the present disclosure is not limited thereto. In other words, the filter rod 203 may be composed of a plurality of segments. For example, the filter rod 203 may include a first segment configured to cool an aerosol and a second segment configured to remove a predetermined component included in the aerosol. In addition, the filter rod 203 may further include at least one segment configured to perform other functions, as needed.

The cigarette 201 may be packed using at least one wrapper 205. The wrapper 205 may have at least one hole formed therein to allow external air to be introduced thereinto or to allow internal gas to be discharged therefrom. In one example, the cigarette 201 may be packed using one wrapper 205. In another example, the cigarette 201 may be doubly packed using two or more wrappers 205. For example, the tobacco rod 202 may be packed using a first wrapper. For example, the filter rod 203 may be packed using a second wrapper. The tobacco rod 202 and the filter rod 203, which are individually packed using separate wrappers, may be coupled to each other. The entire cigarette 201 may be packed using a third wrapper. When each of the tobacco rod 202 and the filter rod 203 is composed of a plurality of segments, each segment may be packed using a separate wrapper. The entire cigarette 201, formed by coupling segments, each of which is packed using a separate wrapper, to each other, may be packed using another wrapper.

The tobacco rod 202 may include an aerosol-generating substance. For example, the aerosol-generating substance may include at least one of glycerin, propylene glycol, ethylene glycol, dipropylene glycol, diethylene glycol, triethylene glycol, tetraethylene glycol, or oleyl alcohol, but the present disclosure is not limited thereto. Also, the tobacco rod 202 may include other additives, such as a flavoring agent, a wetting agent, and/or an organic acid. Also, a flavoring liquid, such as menthol or a moisturizer, may be injected into and added to the tobacco rod 202.

The tobacco rod 202 may be manufactured in various forms. For example, the tobacco rod 202 may be formed as a sheet or a strand. For example, the tobacco rod 202 may be formed as shredded tobacco, which is formed by cutting a tobacco sheet into tiny bits. For example, the tobacco rod 202 may be surrounded by a thermally conductive material. For example, the thermally conductive material may be a metal foil such as aluminum foil, but the present disclosure is not limited thereto. In one example, the thermally conductive material surrounding the tobacco rod 202 may uniformly distribute heat transmitted to the tobacco rod 202, thereby improving conduction of the heat applied to the tobacco rod. This may improve the taste of the tobacco. The thermally conductive material surrounding the tobacco rod 202 may function as a susceptor that is heated by the induction heater. Here, although not illustrated in the drawings, the tobacco rod 202 may further include an additional susceptor, in addition to the thermally conductive material surrounding the tobacco rod 202.

The filter rod 203 may be a cellulose acetate filter. The filter rod 203 may be formed in any of various shapes. For example, the filter rod 203 may be a cylinder-type rod. For example, the filter rod 203 may be a hollow tube-type rod. For example, the filter rod 203 may be a recess-type rod. When the filter rod 203 is composed of a plurality of segments, at least one of the plurality of segments may be formed in a different shape.

The filter rod 203 may be formed to generate flavors. In one example, a flavoring liquid may be injected into the filter rod 203. In one example, a separate fiber coated with a flavoring liquid may be inserted into the filter rod 203.

In addition, the filter rod 203 may include at least one capsule 204. Here, the capsule 204 may function to generate a flavor. The capsule 204 may function to generate an aerosol. For example, the capsule 204 may have a structure in which a liquid containing a flavoring material is wrapped with a film. The capsule 204 may have a spherical or cylindrical shape, but the present disclosure is not limited thereto.

When the filter rod 203 includes a segment configured to cool the aerosol, the cooling segment may be made of a polymer material or a biodegradable polymer material. For example, the cooling segment may be made of pure polylactic acid alone, but the present disclosure is not limited thereto. Alternatively, the cooling segment may be formed as a cellulose acetate filter having a plurality of holes formed therein. However, the cooling segment is not limited to the above-described example, and any other type of cooling segment may be used, so long as the same is capable of cooling the aerosol.

Although not illustrated in FIG. 2B, the cigarette 201 according to an embodiment may further include a front-end filter. The front-end filter may be located at the side of the tobacco rod 202 that faces the filter rod 203. The front-end filter may prevent the tobacco rod 202 from becoming detached outwards. The front-end filter may prevent a liquefied aerosol from flowing into the aerosol-generating device 100 from the tobacco rod 202 during inhalation by the user.

Figure 3:
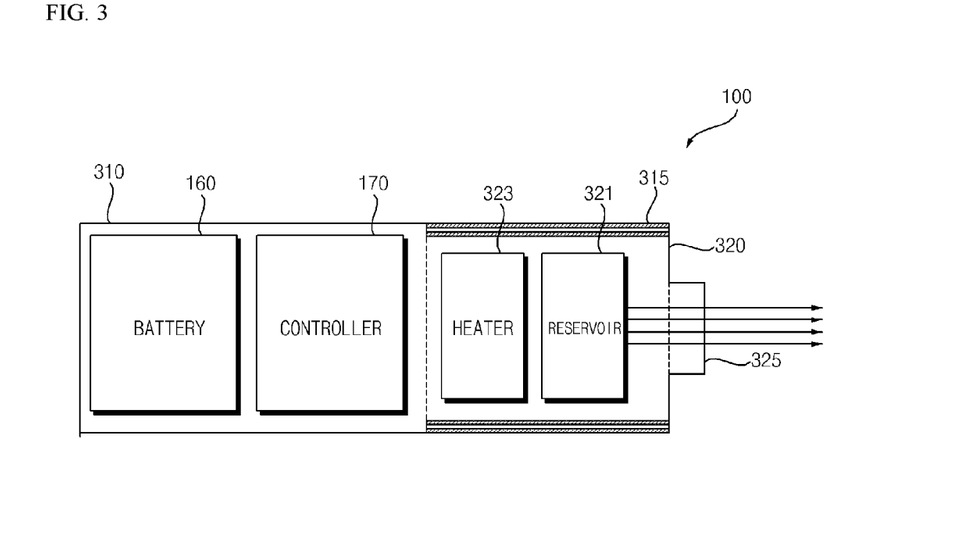

Referring to FIG. 3, the aerosol-generating device 100 according to an embodiment may include a main body 310 and a cartridge 320. The main body 310 may support the cartridge 320, and the cartridge 320 may contain an aerosol-generating substance.

According to one embodiment, the cartridge 320 may be configured so as to be detachably mounted to the main body 310. According to another embodiment, the cartridge 320 may be formed integrally with the main body 310. For example, the cartridge 320 may be mounted to the main body 310 in a manner such that at least a portion of the cartridge 320 is inserted into the inner space formed by a housing 315 of the main body 310.

The main body 310 may be formed to have a structure in which external air can be introduced into the main body 310 in the state in which the cartridge 320 is inserted thereinto. Here, the external air introduced into the main body 310 may flow into the user's mouth via the cartridge 320.

The controller 170 may determine whether the cartridge 320 is in a mounted state or a detached state using a cartridge detection sensor included in the sensor module 150. For example, the cartridge detection sensor may transmit a pulse current through a terminal connected to the cartridge 320. In this case, the cartridge detection sensor may determine whether the cartridge 320 is in a connected state, based on whether the pulse current is received through another terminal.

The cartridge 320 may include a reservoir 321 configured to contain the aerosol-generating substance and/or a heater 323 configured to heat the aerosol-generating substance in the reservoir 321. For example, a liquid delivery element impregnated with (containing) the aerosol-generating substance may be disposed inside the reservoir 321. The electrically conductive track of the heater 323 may be formed in a structure that is wound around the liquid delivery element. In this case, when the liquid delivery element is heated by the heater 323, an aerosol may be generated. Here, the liquid delivery element may include a wick made of, for example, cotton fiber, ceramic fiber, glass fiber, or porous ceramic.

The cartridge 320 may include a mouthpiece 325. Here, the mouthpiece 325 may be a portion to be inserted into a user's oral cavity. The mouthpiece 325 may have a discharge hole through which the aerosol is discharged to the outside during a puff.

Figure 4:
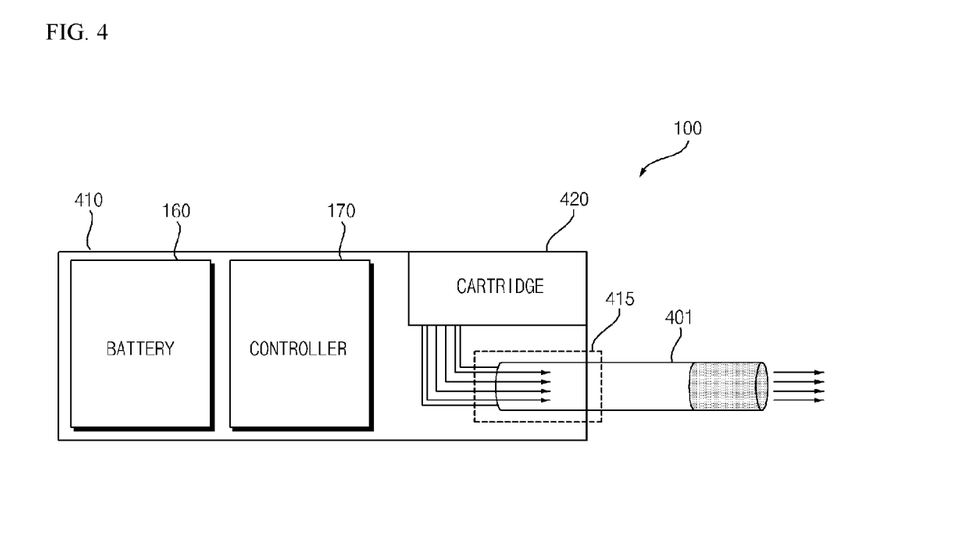

Referring to FIG. 4, the aerosol-generating device 100 according to an embodiment may include a main body 410 supporting the cartridge 420 and a cartridge 420 containing an aerosol-generating substance. The main body 410 may be formed so as to allow a cigarette 401 to be inserted into an inner space 415 therein.

The aerosol-generating device 100 may include a first heater for heating the aerosol-generating substance stored in the cartridge 420. For example, when the user holds one end of the cigarette 401 in the mouth to inhale the aerosol, the aerosol generated by the first heater may pass through the cigarette 401. At this time, while the aerosol passes through the cigarette 401, a tobacco material may be added to the aerosol. The aerosol containing the tobacco material may be drawn into the user's oral cavity through one end of the cigarette 401.

Alternatively, according to another embodiment, the aerosol-generating device 100 may include a first heater for heating the aerosol-generating substance stored in the cartridge 420 and a second heater for heating the cigarette 401 inserted into the main body 410. For example, the aerosol-generating device 100 may generate an aerosol by heating the aerosol-generating substance stored in the cartridge 420 and the cigarette 401 using the first heater and the second heater, respectively.

Figure 5A:
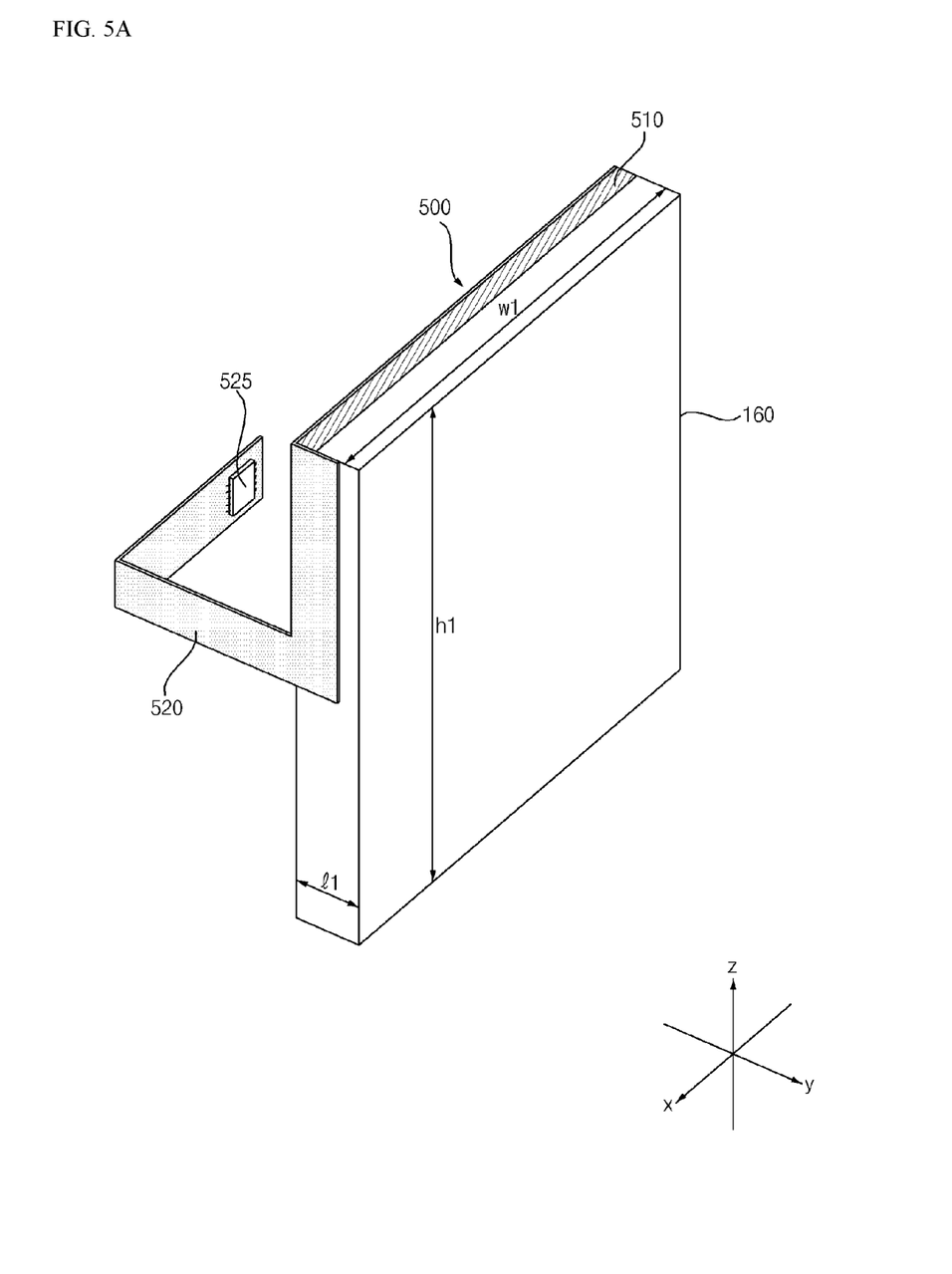
FIGS. 5A to 5C are views for explaining a protection circuit module (PCM) and a battery included in an aerosol-generating device according to an embodiment of the present disclosure.
Figure 5B:
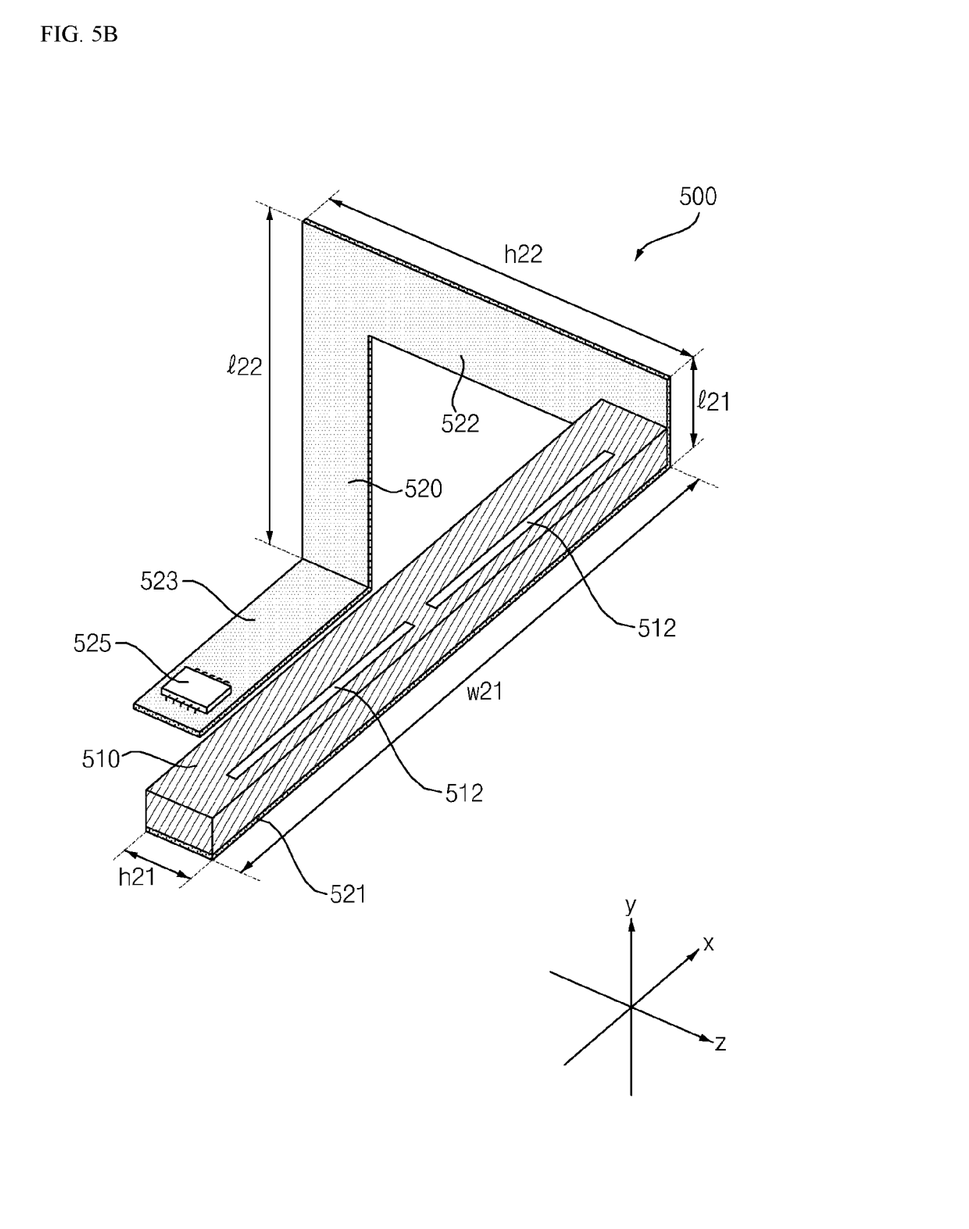
Figure 5C:
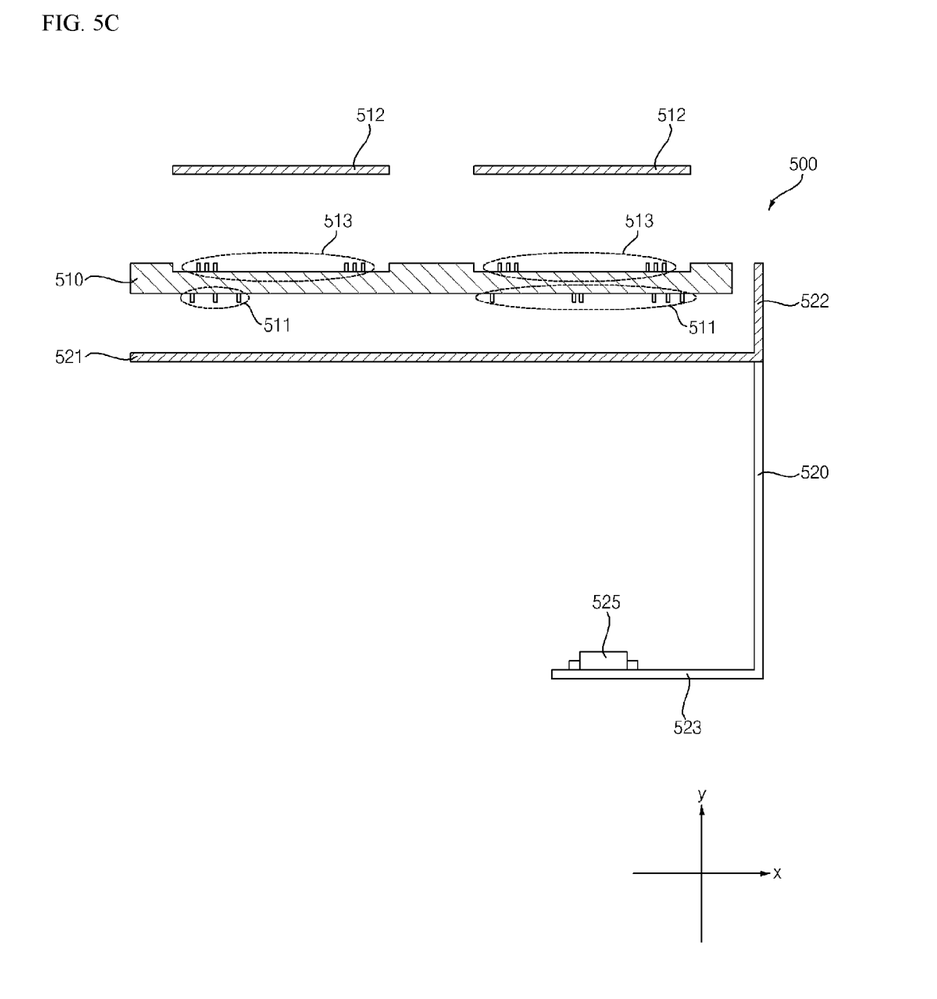

FIGS. 5A to 5C are views for explaining a protection circuit module (PCM) and a battery included in the aerosol-generating device according to an embodiment of the present disclosure.

Referring to FIGS. 5A to 5C, the aerosol-generating device 100 may further include a protection circuit module (PCM) 500. The protection circuit module (PCM) 500 may be a circuit that controls at least one function of the battery 160 to protect the battery 160. The protection circuit module (PCM) 500 may be disposed adjacent to the upper surface of the battery 160. The protection circuit module (PCM) 500 may be connected to a terminal (not shown) of the battery 160 through which current flows. For example, in order to prevent overcharging and overdischarging of the battery 160, the protection circuit module (PCM) 500 may cut off the electrical path to the battery 160 when a short circuit occurs in a circuit connected to the battery 160, when an excessively high voltage is applied to the battery 160, or when an excessive amount of current flows through the battery 160.

A direction parallel to the width direction of the battery 160 may be referred to as a first direction, a width direction, a +x-axis direction, or a −x-axis direction. A direction parallel to the longitudinal direction of the battery 160 may be referred to as a second direction, a longitudinal direction, a +y-axis direction, or a −y-axis direction. A direction parallel to the height direction of the battery 160 may be referred to as a third direction, a height direction, a +z-axis direction, or a −z-axis direction. The third direction may be a direction perpendicular to the first direction and/or the second direction. The first direction and the second direction may be collectively referred to as a horizontal direction. The third direction may be referred to as a vertical direction.

The protection circuit module (PCM) 500 may include a package module 510, a circuit board 520 coupled to the package module 510, and/or a connector 525 connected to an external component (e.g. a printed circuit board).

The package module 510 may include at least one integrated circuit (IC), which includes multiple active elements and passive elements for protecting the battery 160. The package module 510 may include at least one integrated circuit in an inner sealed space therein. In this case, the package module 510 may include a single integrated circuit (IC) in which multiple active elements and passive elements for protecting the battery 160 are formed on a single semiconductor wafer.

For example, the package module 510 may be configured such that an encapsulant (not shown) encapsulates the integrated circuit (IC). The present disclosure is not limited to any specific material of the encapsulant. For example, the encapsulant may include a thermosetting resin such as an epoxy resin, a thermoplastic resin such as polyimide, or a resin further containing a reinforcing material such as an inorganic filler. Also, a molding material such as an epoxy molding compound (EMC) may be used as the encapsulant.

In this case, the encapsulant may be formed to encapsulate the entirety of the integrated circuit (IC), except for at least a portion of a first connection structure 511 and at least a portion of a second connection structure 513. The first connection structure 511 may electrically connect the integrated circuit (IC) to the circuit board 520. The second connection structure 513 may electrically connect the integrated circuit (IC) to the battery 160. That is, the integrated circuit (IC) may be located in the inner sealed space encapsulated by the encapsulant so as not to be exposed to the outside. Only the portion of the first connection structure 511 and the portion of the second connection structure 513 that are electrically connected to the integrated circuit (IC) may be exposed to the outside.

At least a portion of the circuit board 520 may be a flexible printed circuit board (FPCB).

The circuit board 520 may be formed so as to be bent corresponding to the height difference and the spacing distance between the battery 160 and an external component (e.g. a printed circuit board).

The circuit board 520 may include a battery connection portion 521 on which the package module 510 is disposed, an outer connection portion 523 on which the connector 525 is disposed, and an intermediate connection portion 522 interconnecting the battery connection portion 521 and the outer connection portion 523. The package module 510 and the connector 525 may be electrically connected to each other by the circuit board 520.

The intermediate connection portion 522 may include a first portion, which is bent from one end of the battery connection portion 521 in the second direction and extends a first length l21, a second portion, which is bent from one end of the outer connection portion 523 in the second direction and extends a second length l22, and a third portion, interconnecting the first portion and the second portion.

The first length l21 of the first portion of the intermediate connection portion 522 may be shorter than the length l1 of the battery 160. The second length l22 of the second portion of the intermediate connection portion 522 may be longer than the first length l21 of the first portion. The overall height h22 of the intermediate connection portion 522 may be shorter than the height h1 of the battery 160. The second length l22 of the second portion of the intermediate connection portion 522 may be equal to or longer than the sum of the spacing distance between an external component (e.g. a printed circuit board) and the battery 160 and the length of the external component (e.g. the printed circuit board) in the longitudinal direction. The second length l22 of the second portion of the intermediate connection portion 522 may be equal to or shorter than the sum of the spacing distance between the external component (e.g. the printed circuit board) and the battery 160, the length of the external component (e.g. the printed circuit board) in the longitudinal direction, and the length l1 of the battery 160.

One surface of the package module 510, to the outside of which the first connection structure 511 is exposed, may be in contact with the circuit board 520. The opposite surface of the package module 510, to the outside of which the second connection structure 513 is exposed, may be in contact with the battery 160.

The package module 510 may be mounted on one surface of the battery connection portion 521 using at least a portion of the first connection structure 511 exposed to the outside. In this case, the first connection structure 511 may be attached to the battery connection portion 521 through soldering.

In the case in which the opposite surface of the package module 510 is in contact with the battery 160, the package module 510 may be disposed such that a portion of the second connection structure 513 exposed to the outside of the opposite surface of the package module 510 is in contact with the terminal of the battery 160. In this case, the intermediate connection portion 522 of the circuit board 520 may be disposed so as to be in contact with one side surface of the battery 160.

The surface of the battery connection portion 521 on which the package module 510 is mounted and the surface of the outer connection portion 523 on which the connector 525 is mounted may be oriented in the same direction.

According to an embodiment, a battery connector 512, which is in contact with the terminal of the battery 160, may be connected to a portion of the second connection structure 513 exposed to the outside. In this case, the battery connector 512 may be configured so as to be attached or detached to or from the terminal of the battery 160.

In addition, according to an embodiment, the package module 510 may include a battery temperature sensor (not shown) for sensing the temperature of the battery 160. The battery temperature sensor may be disposed in the inner sealed space in the package module 510 together with the integrated circuit (IC). In this case, the battery temperature sensor may be located in the inner space in the package module 510 so as to be adjacent to the opposite surface of the package module 510, which is in contact with the battery 160.

For example, the package module 510 may be configured such that the encapsulant encapsulates both the integrated circuit (IC) and the battery temperature sensor. In this case, the encapsulant may be formed so as to encapsulate the entirety of the integrated circuit (IC) and the battery temperature sensor, except for at least a portion of the first connection structure, which electrically connects the integrated circuit (IC), the battery temperature sensor, and the circuit board 520 to each other, and at least a portion of the second connection structure, which electrically connects the integrated circuit (IC) and the battery 160 to each other.

That is, the integrated circuit (IC) and the battery temperature sensor may be located in the inner sealed space encapsulated by the encapsulant so as not to be exposed to the outside. Only the portion of the first connection structure 511 that is electrically connected to the integrated circuit (IC) and the battery temperature sensor and the portion of the second connection structure 513 that is electrically connected to the integrated circuit (IC) may be exposed to the outside.

Figure 6A:
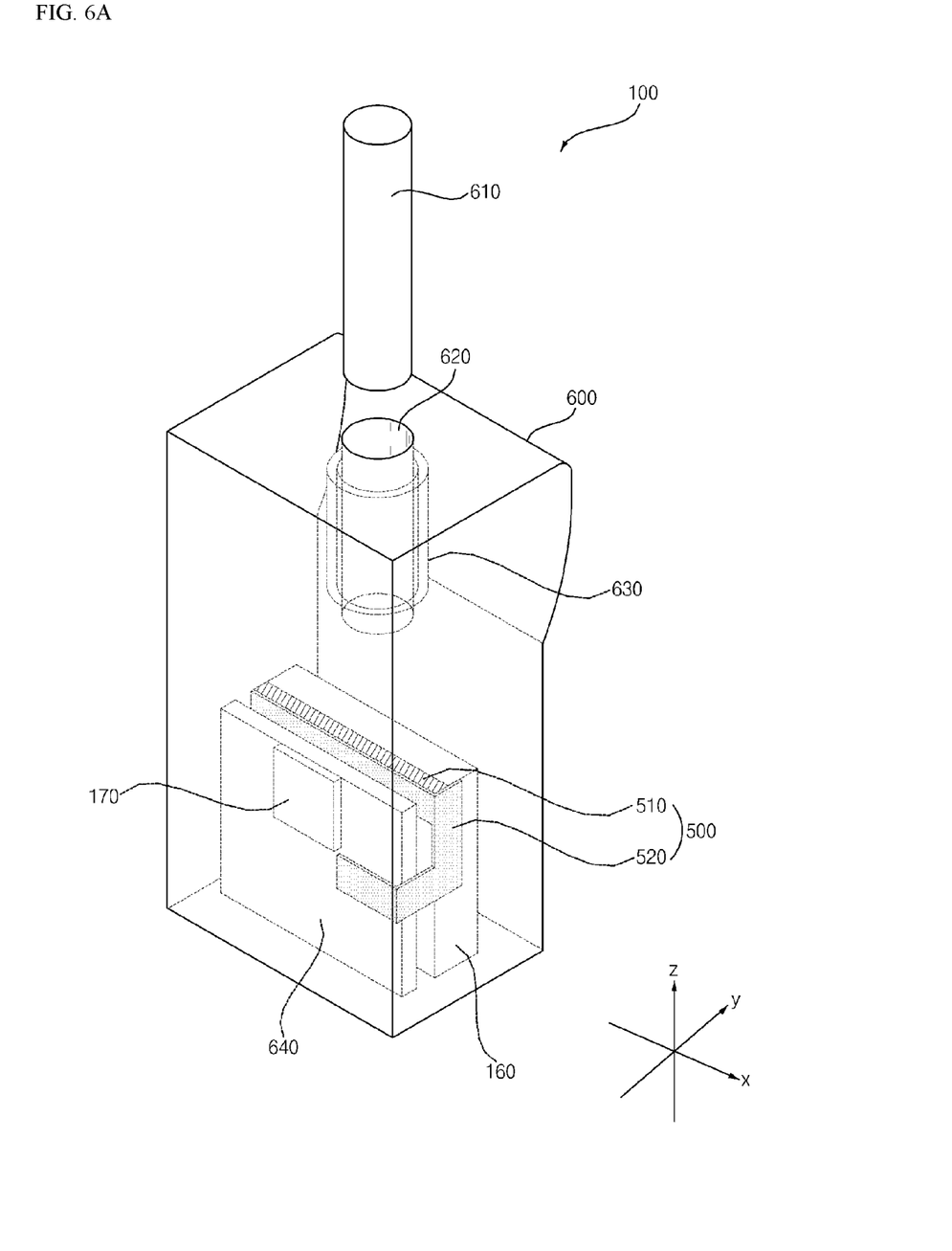
FIGS. 6A and 6B are views for explaining an aerosol-generating device according to an embodiment of the present disclosure.
Figure 6B:
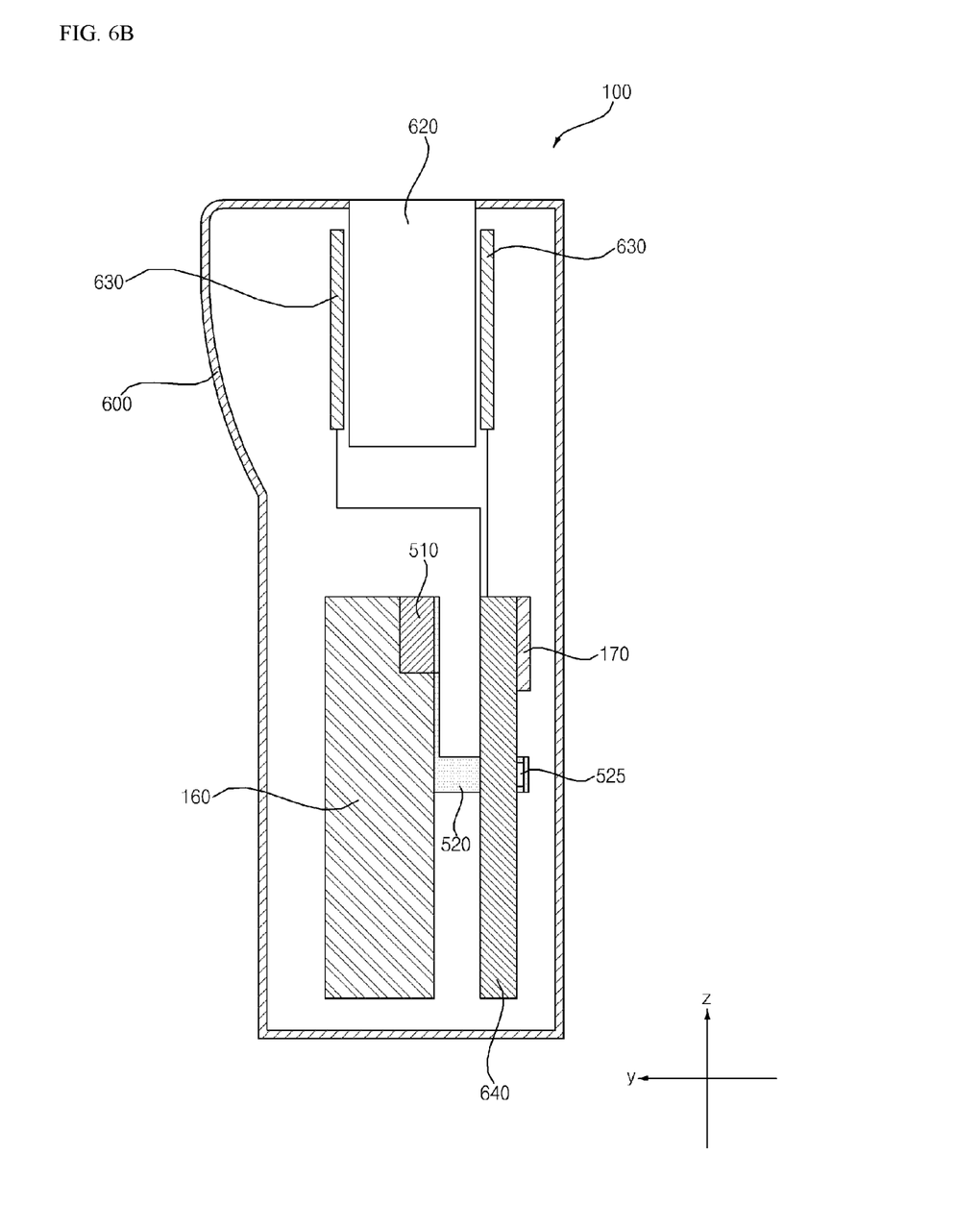

FIGS. 6A and 6B are views for explaining an aerosol-generating device according to an embodiment of the present disclosure.

FIG. 6A is an example of a perspective view of the aerosol-generating device 100 when viewed in one direction, and FIG. 6B is an example of a side-sectional view of the aerosol-generating device 100.

Referring to FIGS. 6A and 6B, the battery 160, the printed circuit board 640 on which the controller 170 is mounted, the protection circuit module (PCM) 500 interconnecting the battery 160 and the printed circuit board 640, and the heater 630 may be disposed in the main body 600 of the aerosol-generating device 100.

The protection circuit module (PCM) 500 may be disposed such that the package module 510 is in contact with the upper surface of the battery 160. The protection circuit module (PCM) 500 may be disposed such that the connector 525 connected to the circuit board 520 is in contact with the printed circuit board 640.

The components included in the aerosol-generating device 100 may be mounted on one surface or both surfaces of the printed circuit board 640. The components mounted on one surface or both surfaces of the printed circuit board 640 may transmit and receive signals to and from each other through a wiring layer of the printed circuit board 640. For example, the communication module included in the communication interface 110, the display included in the input/output interface 120, the memory 140, and the controller 170 may be mounted on the printed circuit board 640.

The battery temperature sensor included in the package module 510 of the protection circuit module (PCM) 500 may transmit signals indicating the temperature of the battery 160 to the controller 170 mounted on the printed circuit board 640 via the circuit board 520 and the connector 525. The controller 170 may determine whether the battery 160 is overheated based on the signals received from the battery temperature sensor.

The electric power stored in the battery 160 may be supplied to the printed circuit board 640 via the protection circuit module (PCM) 500.

The heater 630 may be disposed adjacent to a cigarette insertion space 620 formed in the upper end of the main body 600 so as to allow a cigarette 610 to be inserted thereinto. The heater 630 may heat the cigarette 610 disposed in the cigarette insertion space 620 using the electric power of the battery 160 transmitted via the printed circuit board 640.

The cigarette insertion space 620 may be a space formed by being depressed by a predetermined depth toward the interior of the aerosol-generating device 100 so that the cigarette 610 is inserted at least partway thereinto.

In this case, the depth of the cigarette insertion space 620 may correspond to the length of the portion of the cigarette 610 that contains an aerosol-generating substance. For example, in the case in which the cigarette 201 shown in FIG. 2B is capable of being used in the aerosol-generating device 100, the depth of the cigarette insertion space 620 may be equal to the length of the tobacco rod 202 of the cigarette 201.

The internal structure of the aerosol-generating device 100 is not limited to that shown in FIGS. 6A and 6B. The arrangement of the battery 160, the controller 170, and the heater 630 may vary depending on the embodiment or design.

As described above, according to at least one of the embodiments of the present disclosure, it is possible to prevent the elements for protecting the battery included in the integrated circuit (IC) from being exposed to foreign substances.

In addition, according to at least one of the embodiments of the present disclosure, it is possible to prevent the battery temperature sensor from being damaged by foreign substances more reliably than in the case in which a separate battery temperature sensor is disposed adjacent to the battery 160.

Referring to FIGS. 1 to 6B, a protection circuit module 500 according to an embodiment of the present disclosure may be electrically connected to a battery 160 to control at least one function of the battery 160, and may include a package module 510 including an integrated circuit (IC), including multiple active elements and passive elements to protect the battery 160, in an inner sealed space therein, the package module 510 being disposed so as to be in contact with the battery 160, a connector 525 coupled to a printed circuit board 640, and a circuit board 520 on which the connector 525 and the package module 510 are mounted, the circuit board 520 electrically interconnecting the connector 525 and the package module 510.

An aerosol-generating device 100 according to an embodiment of the present disclosure may include a heater 630 configured to heat an aerosol-generating substance, a printed circuit board 640 on which a controller 170 configured to control the operation of the heater is mounted, a battery 160 configured to supply electric power to the heater under the control of the controller 170, and a protection circuit module 500 electrically connected to the battery 160 to control at least one function of the battery 160. The protection circuit module 500 may include a package module 510 including an integrated circuit (IC), including multiple active elements and passive elements to protect the battery 160, in an inner sealed space therein, the package module 510 being disposed so as to be in contact with the battery 160, a connector 525 coupled to the printed circuit board 640, and a circuit board 520 on which the connector 525 and the package module 510 are mounted, the circuit board 520 electrically interconnecting the connector 525 and the package module 510.

In addition, in the aerosol-generating device 100 according to an embodiment of the present disclosure, the package module 510 may further include a first connection structure 511 connected to the integrated circuit (IC), a second connection structure 513 connected to the integrated circuit (IC), and an encapsulant formed to encapsulate the entirety of the integrated circuit (IC), except for at least a portion of the first connection structure 511 and at least a portion of the second connection structure. The first connection structure 511 may electrically interconnect the integrated circuit (IC) and the circuit board 520, and the second connection structure 513 may electrically interconnect the integrated circuit (IC) and the battery 160.

In addition, in the aerosol-generating device 100 according to an embodiment of the present disclosure, the portion of the first connection structure 511 that is exposed to the outside of the package module 510 may be attached to the circuit board 520 through soldering, and the portion of the second connection structure 513 that is exposed to the outside of the package module 510 may be in contact with a terminal of the battery 160 through which current flows.

In addition, in the aerosol-generating device 100 according to an embodiment of the present disclosure, the circuit board 520 may include a battery connection portion 521 on which the package module 510 is disposed, an outer connection portion 523 on which the connector 525 is disposed, and an intermediate connection portion 522 interconnecting the battery connection portion 521 and the outer connection portion 523. The intermediate connection portion 522 may be disposed such that at least a portion thereof is in contact with one side surface of the battery 160.

In addition, in the aerosol-generating device 100 according to an embodiment of the present disclosure, each of the battery connection portion 521 and the outer connection portion 523 may be formed to extend in a first direction, and the intermediate connection portion 522 may include a first portion formed to be bent from one end of the battery connection portion 521 in a second direction and to extend a first length, the second direction being perpendicular to the first direction, a second portion formed to be bent from one end of the outer connection portion 523 in the second direction and to extend a second length, and a third portion formed to extend in a third direction to interconnect the first portion and the second portion, the third direction being perpendicular to the first direction and the second direction. The first length may be shorter than the second length.

In addition, in the aerosol-generating device 100 according to an embodiment of the present disclosure, the surface of the battery connection portion 521 on which the package module 510 is disposed and the surface of the outer connection portion 523 on which the connector 525 is disposed may be oriented in the same direction.

In addition, in the aerosol-generating device 100 according to an embodiment of the present disclosure, the package module 510 may further include a battery temperature sensor configured to sense the temperature of the battery 160, the battery temperature sensor being located in the inner sealed space encapsulated by the encapsulant. The battery temperature sensor may be disposed in the inner sealed space so as to be adjacent to the surface of the package module 510 that is in contact with the battery 160.

In addition, in the aerosol-generating device 100 according to an embodiment of the present disclosure, the battery temperature sensor may be electrically connected to the first connection structure, and may transmit signals indicating the temperature of the battery 160 to the controller 170 mounted on the printed circuit board 640 via the circuit board 520 and the connector 525. The controller 170 may determine whether the battery 160 is overheated based on the signals received from the battery temperature sensor.

Certain embodiments or other embodiments of the disclosure described above are not mutually exclusive or distinct from each other. Any or all elements of the embodiments of the disclosure described above may be combined with another or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An aerosol-generating device comprising:
   a heater configured to heat an aerosol-generating substance;
   a first circuit board on which a controller configured to control operation of the heater is mounted;
   a battery configured to supply electric power to the heater under control of the controller; and
   a protection circuit module comprising:
      a second circuit board;
      a package module mounted on the second circuit board and disposed to be in contact with the battery, wherein the package module comprises at least an integrated circuit configured to protect the battery and wherein the at least integrated circuit is disposed in an inner sealed space of the package module; and
      a connector configured to be coupled to the first circuit board, wherein the second circuit board is electrically connected to the connector.

2. The aerosol-generating device according to claim 1, wherein the package module further comprises:
   a first connection structure and a second connection structure electrically connected to the at least integrated circuit; and
   an encapsulant formed to encapsulate the at least integrated circuit in the inner sealed space, except for at least a portion of the first connection structure and at least a portion of the second connection structure,
   wherein the first connection structure electrically connects the integrated circuit and the second circuit board, and
   wherein the second connection structure electrically connects the at least integrated circuit and the battery.

3. The aerosol-generating device according to claim 2, wherein the at least portion of the first connection structure that is exposed outside the package module is soldered to the second circuit board, and
   wherein the at least portion of the second connection structure that is exposed outside the package module is electrically connected to a terminal of the battery through which current flows.

4. The aerosol-generating device according to claim 1, wherein the second circuit board comprises:
   a battery connection portion on which the package module is mounted;
   an outer connection portion on which the connector is mounted; and
   an intermediate connection portion interconnecting the battery connection portion and the outer connection portion,
   wherein the intermediate connection portion is disposed such that at least a portion of the intermediate connection portion is in contact with one side surface of the battery.

5. The aerosol-generating device according to claim 4, wherein the battery connection portion and the outer connection portion are formed to extend in a first direction,
   wherein the intermediate connection portion comprises:
      a first portion angled from one end of the battery connection portion in a second direction and extending a first length, the second direction being perpendicular to the first direction;
      a second portion angled from one end of the outer connection portion in the second direction and extending a second length; and
      a third portion extending in a third direction to interconnect the first portion and the second portion, the third direction being perpendicular to both the first direction and the second direction, and
   wherein the first length is shorter than the second length.

6. The aerosol-generating device according to claim 5, wherein a surface of the battery connection portion on which the package module is disposed and a surface of the outer connection portion on which the connector is disposed are oriented in a same direction.

7. The aerosol-generating device according to claim 1, wherein the package module further comprises a battery temperature sensor configured to sense a temperature of the battery, and
   wherein the battery temperature sensor is disposed in the inner sealed space so as to be adjacent to a surface of the package module that is in contact with the battery.

8. The aerosol-generating device according to claim 7, wherein the battery temperature sensor is configured to provide a signal indicating a temperature of the battery to the controller mounted on the first circuit board via the second circuit board and the connector, and
   wherein the controller is configured to determine whether the battery is overheated based on the signal.

9. A protection circuit module electrically connected to a battery of a device, the protection circuit module comprising:
   a second circuit board;
   a package module mounted on the second circuit board and disposed to be in contact with the battery, wherein the package module comprises at least an integrated circuit configured to protect the battery, and wherein the at least integrated circuit is disposed in an inner sealed space of the package module; and
   a connector configured to be coupled to a first circuit board having a controller for the device mounted thereon;
   wherein the second circuit board is electrically connected to the connector.

10. The protection circuit module according to claim 9, wherein the package module further comprises:
    a first connection structure and a second connection structure electrically connected to the at least integrated circuit; and
    an encapsulant formed to encapsulate the at least integrated circuit in the inner sealed space, except for at least a portion of the first connection structure and at least a portion of the second connection structure,
    wherein the first connection structure electrically connects the integrated circuit and the second circuit board, and wherein the second connection structure electrically connects the at least integrated circuit and the battery.

11. The protection circuit module according to claim 10, wherein a portion of the first connection structure that is exposed outside the package module is soldered to the second circuit board, and
wherein a portion of the second connection structure that is exposed outside the package module is electrically connected to a terminal of the battery through which current flows.

12. The protection circuit module according to claim 9, wherein the second circuit board comprises:
a battery connection portion on which the package module is mounted;
an outer connection portion on which the connector is mounted; and
an intermediate connection portion interconnecting the battery connection portion and the outer connection portion,
wherein the intermediate connection portion is disposed such that at least a portion of the intermediate connection portion is in contact with one side surface of the battery.

13. The protection circuit module according to claim 12, wherein the battery connection portion and the outer connection portion are formed to extend in a first direction, wherein the intermediate connection portion comprises:
a first portion angled from one end of the battery connection portion in a second direction and extending a first length, the second direction being perpendicular to the first direction;
a second portion angled from one end of the outer connection portion in the second direction and extending a second length; and
a third portion extending in a third direction to interconnect the first portion and the second portion, the third direction being perpendicular to both the first direction and the second direction, and
wherein the first length is shorter than the second length.

14. The protection circuit module according to claim 13, wherein a surface of the battery connection portion on which the package module is disposed and a surface of the outer connection portion on which the connector is disposed are oriented in a same direction.

15. The protection circuit module according to claim 9, wherein the package module further comprises a battery temperature sensor configured to sense a temperature of the battery, and
wherein the battery temperature sensor is disposed in the inner sealed space so as to be adjacent to a surface of the package module that is in contact with the battery.

* * * * *